United States Patent
Bergendahl et al.

(10) Patent No.: US 9,450,095 B1
(45) Date of Patent: Sep. 20, 2016

(54) SINGLE SPACER FOR COMPLEMENTARY METAL OXIDE SEMICONDUCTOR PROCESS FLOW

(71) Applicant: INTERNATIONAL BUSINESS MACHINES CORPORATION, Armonk, NY (US)

(72) Inventors: Marc A. Bergendahl, Troy, NY (US); Kangguo Cheng, Schenectady, NY (US); Jessica Dechene, Watervliet, NY (US); Fee Li Lie, Albany, NY (US); Eric R. Miller, Schenectady, NY (US); Jeffrey C. Shearer, Albany, NY (US); John R. Sporre, Albany, NY (US); Sean Teehan, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/015,512

(22) Filed: Feb. 4, 2016

(51) Int. Cl.
| | |
|---|---|
| *H01L 29/66* | (2006.01) |
| *H01L 29/78* | (2006.01) |
| *H01L 21/8238* | (2006.01) |
| *H01L 27/092* | (2006.01) |
| *H01L 29/08* | (2006.01) |
| *H01L 29/161* | (2006.01) |
| *H01L 29/16* | (2006.01) |
| *H01L 29/165* | (2006.01) |

(52) U.S. Cl.
CPC ... *H01L 29/7848* (2013.01); *H01L 21/823814* (2013.01); *H01L 21/823821* (2013.01); *H01L 21/823864* (2013.01); *H01L 27/0924* (2013.01); *H01L 29/0847* (2013.01); *H01L 29/161* (2013.01); *H01L 29/165* (2013.01); *H01L 29/1608* (2013.01)

(58) Field of Classification Search
CPC ............ H01L 29/7848; H01L 29/0847; H01L 29/1608; H01L 29/161; H01L 29/165; H01L 21/523814; H01L 21/823821; H01L 21/823864; H01L 27/0924
See application file for complete search history.

(56) References Cited

U.S. PATENT DOCUMENTS

| | | | |
|---|---|---|---|
| 5,869,879 | A | 2/1999 | Fulford, Jr. et al. |
| 7,321,155 | B2 | 1/2008 | Ko et al. |
| 8,492,839 | B2 | 7/2013 | Doris et al. |
| 8,546,228 | B2 | 10/2013 | Doris et al. |
| 8,617,996 | B1 | 12/2013 | Chi et al. |
| 9,059,318 | B2 | 6/2015 | Majumdar et al. |
| 9,087,741 | B2 | 7/2015 | Cheng et al. |

(Continued)

FOREIGN PATENT DOCUMENTS

WO 2014162164 A1 10/2014

*Primary Examiner* — Yosef Gebreyesus
(74) *Attorney, Agent, or Firm* — Tutunjian & Bitetto, P.C.; Vazken Alexanian

(57) ABSTRACT

A method of forming a semiconductor device that includes forming a high-k dielectric fin liner on the first plurality of fin structures in a first device region and a second plurality of fin structures in a second device region, and forming a gate structure including a low-k dielectric gate sidewall spacer on the channel region of the first and second plurality of fin structures. A first epitaxial semiconductor material on the first plurality of fin structures from which the high-k dielectric fin liner has been removed. The first epitaxial semiconductor material is then oxidized, and a remaining portion of the high-k dielectric fin liner is removed. A second epitaxial semiconductor material is formed on the second plurality of fin structures.

16 Claims, 11 Drawing Sheets

(56) References Cited

U.S. PATENT DOCUMENTS

| | | |
|---|---|---|
| 2008/0258225 A1 | 10/2008 | Yang et al. |
| 2011/0049630 A1 | 3/2011 | Majumdar et al. |
| 2011/0201164 A1* | 8/2011 | Chung ............ H01L 21/823807 438/229 |
| 2012/0187459 A1 | 7/2012 | Pan et al. |
| 2013/0075797 A1* | 3/2013 | Okano .............. H01L 29/66795 257/288 |
| 2015/0147853 A1 | 5/2015 | Cheng et al. |
| 2015/0187660 A1 | 7/2015 | Patzer et al. |
| 2016/0099352 A1* | 4/2016 | Lee .................... H01L 29/7851 257/192 |
| 2016/0148933 A1* | 5/2016 | Cheng ................ H01L 27/0922 257/369 |

* cited by examiner

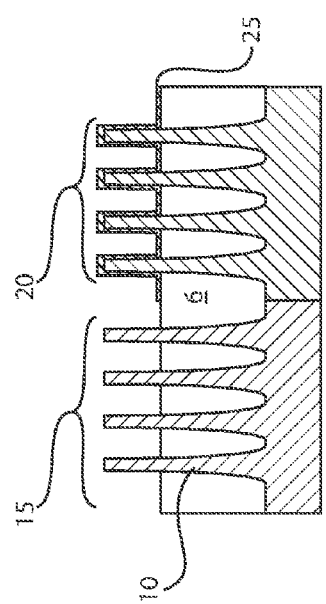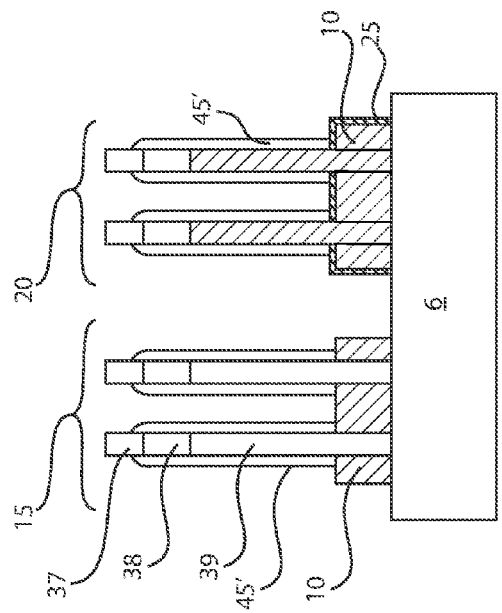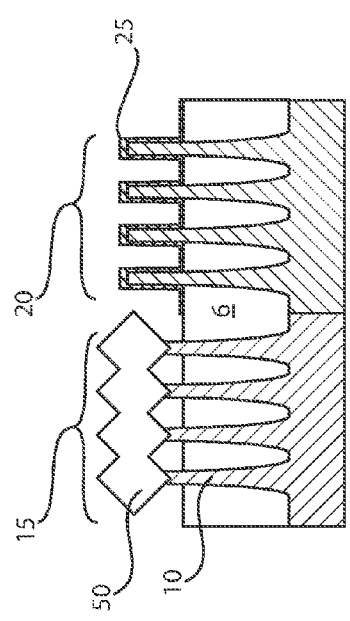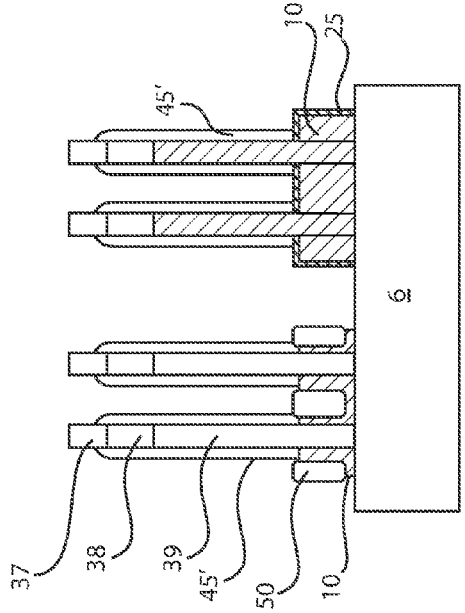

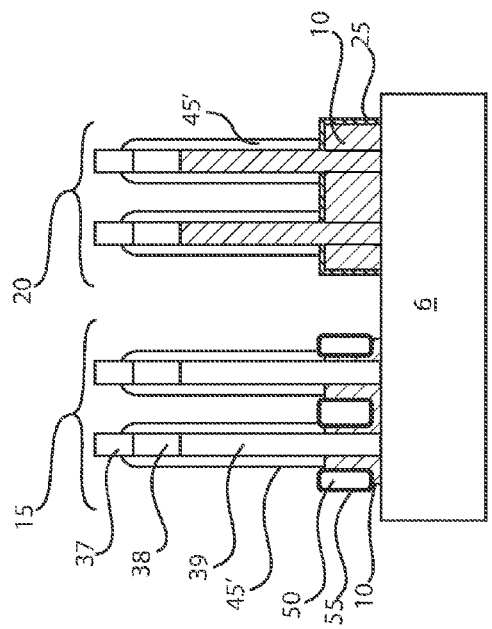
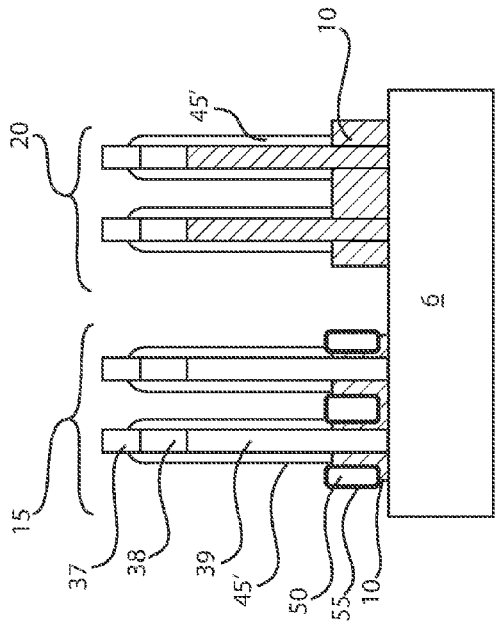
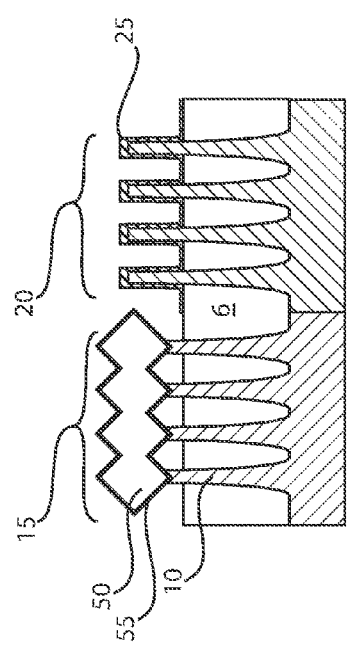
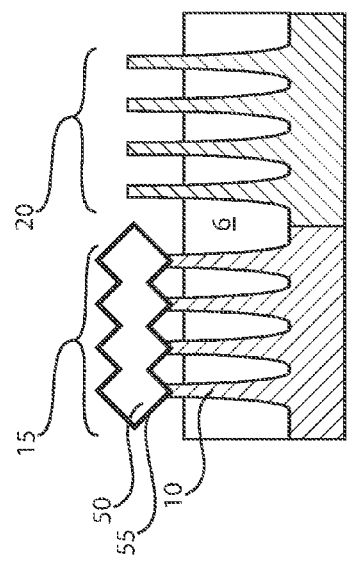

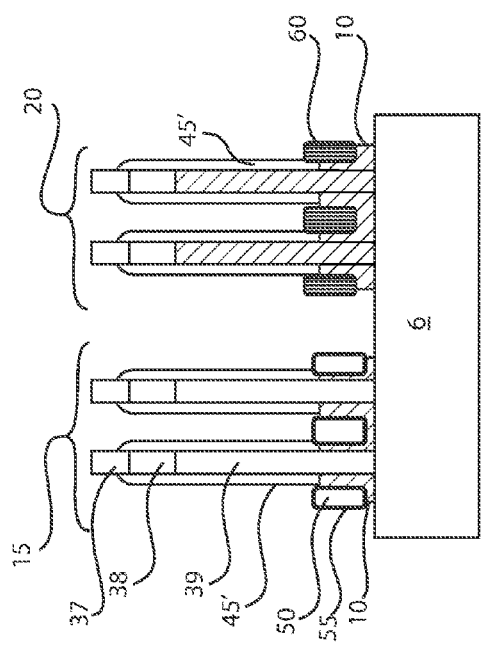
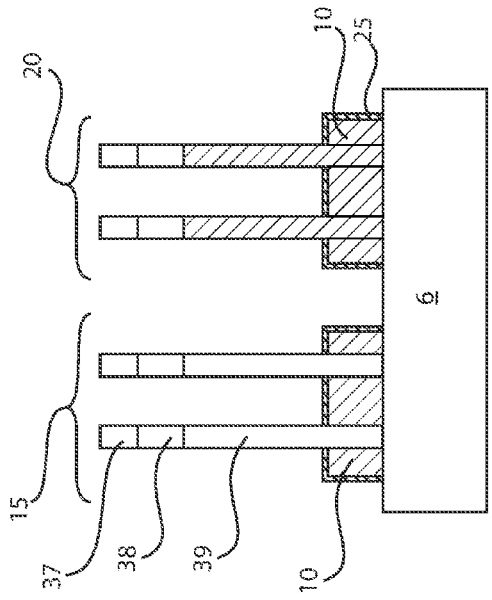
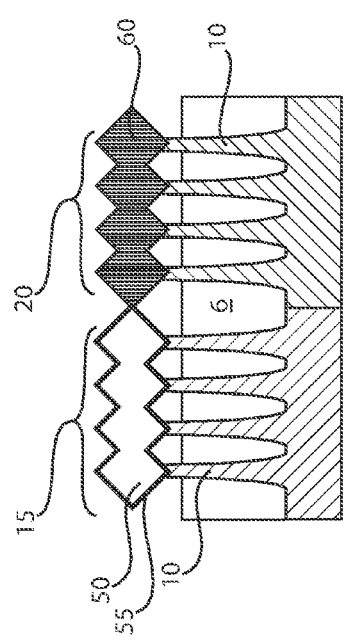
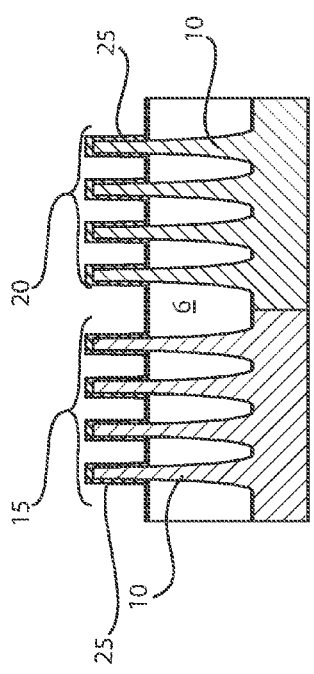
FIG. 11A
FIG. 11B
FIG. 12A
FIG. 12B

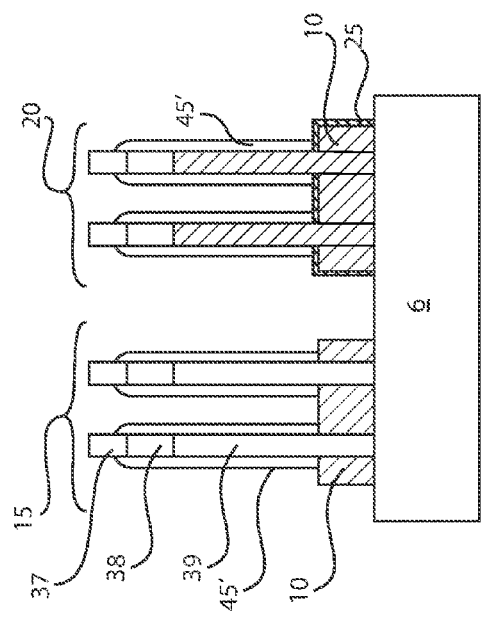
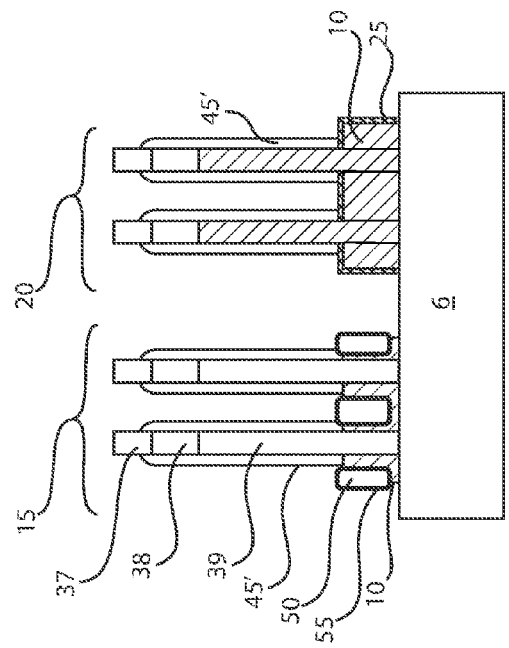
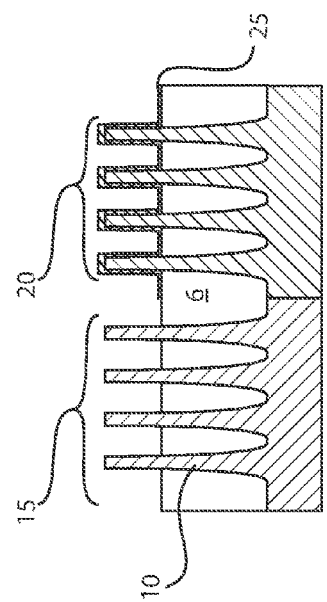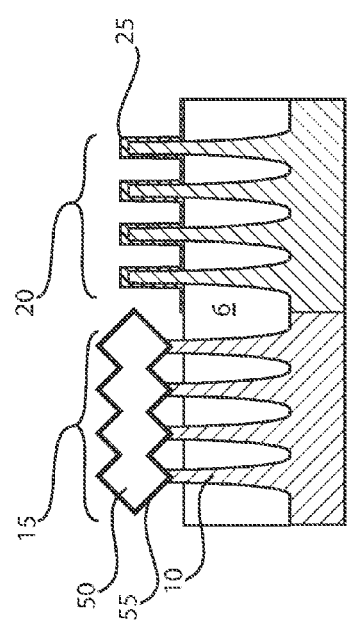

SINGLE SPACER FOR COMPLEMENTARY METAL OXIDE SEMICONDUCTOR PROCESS FLOW

BACKGROUND

1. Technical Field

The present disclosure relates to semiconductor devices, and more particularly to complementary metal oxide semiconductor process flows.

2. Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices. Further, in view of continued scaling and different device geometries low-k spacer materials are also being investigated.

SUMMARY

In one embodiment, a method of forming a semiconductor device is provided that includes providing a first plurality of fin structures in a first conductivity device region and providing a second plurality of fin structures in a second conductivity device region. A high-k dielectric fin liner is formed on at least one of the first and second plurality of fin structures. A gate structure including a low-k dielectric gate sidewall spacer is formed on the channel region of said at least one of the first and second plurality of fin structures. A first epitaxial semiconductor material is formed on one for said first and second plurality of fin structures from which the high-k dielectric fin liner is removed, wherein a remaining portion of the high-k dielectric fin liner remains on a second of said first and second plurality of fin structures to obstruct said first epitaxial semiconductor material from being formed thereon. The first epitaxial semiconductor material is oxidized. A remaining portion of the high-k dielectric fin liner is removed. A second epitaxial semiconductor material is formed on said second of said first and second plurality of fin structures.

In another embodiment, the method of forming a semiconductor device may include forming a dielectric fin liner comprising hafnium and oxygen on at least one of a first plurality of fin structures in a first device region and a second plurality of fin structures in a second device region, and forming a gate structure including a SiOCN dielectric gate sidewall spacer on the channel region of said at least one of the first and second plurality of fin structures. A first epitaxial semiconductor material is formed on one for said first and second plurality of fin structures from which the dielectric fin liner is removed, wherein a remaining portion of the dielectric fin liner remains on a second of said first and second plurality of fin structure. The first epitaxial semiconductor material is oxidized. A remaining portion of the dielectric fin liner is removed. A second epitaxial semiconductor material is formed on said second of said first and second plurality of fin structures.

In another aspect of the present disclosure, as semiconductor device is provide. In one embodiment, the semiconductor device comprises p-type FinFETs in a first device region and n-type FinFETs in a second device region of a substrate. A gate structure may be present on a channel portion for each of the fin structures for each of the p-type and n-type FinFETs. Gate sidewall spacers of a low-k dielectric material are present on the gate structures for each of the n-type FinFETs and the p-type FinFETs. The gate sidewall spacers for each of the n-type and p-type FinFETs have substantially a same width.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 7A is a side cross-sectional view depicting etching the low-k dielectric material layer to form the low-k dielectric gate sidewall spacer, in accordance with one embodiment of the present disclosure.

FIG. 7B is a side cross-sectional view of the structures depicted in FIG. 7A, in which the cross section is through the center of the gate structure. i.e., perpendicular to the gate structure.

FIG. 8A is a side cross-sectional view depicting one embodiment of forming a first epitaxial semiconductor material for the source and drain regions of the semiconductor devices being formed in the first device region, in accordance with one embodiment of the present disclosure.

FIG. 8B is a side cross-sectional view of the structures depicted in FIG. 8A, in which the cross section is through the center of the gate structure. i.e., perpendicular to the gate structure.

FIG. 9A is a side cross-sectional view depicting one embodiment of forming an oxide liner on the first epitaxial semiconductor material, in accordance with one embodiment of the present disclosure.

FIG. 9B is a side cross-sectional view of the structures depicted in FIG. 9A, in which the cross section is through the center of the gate structure.

FIG. 10A is a side cross-sectional view of removing the high-k dielectric fin liner from the fin structures in the second device region, in accordance with one embodiment of the present disclosure.

FIG. 10B is a side cross-sectional view of the structures depicted in FIG. 10A, in which the cross section is through the center of the gate structure. i.e., perpendicular to the gate structure.

FIG. 11A is a side cross-sectional view depicting one embodiment of forming a second epitaxial semiconductor material for the source and drain regions of the semiconductor devices being formed in the second device region, in accordance with one embodiment of the present disclosure.

FIG. 11B is a side cross-sectional view of the structures depicted in FIG. 11A, in which the cross section is through the center of the gate structure.

FIG. 12A is a side cross-sectional view depicting forming a gate structure on the structure depicted in FIG. 2, in accordance with one embodiment of the present disclosure.

FIG. 12B is a side cross-sectional view of the structures depicted in FIG. 12A, in which the cross section is through the center of the gate structure, i.e., perpendicular to the gate structure.

FIG. 15A is a side cross-sectional view depicting etching the low-k dielectric material layer that is depicted in FIG. 14A to form the low-k dielectric gate sidewall spacer, in accordance with one embodiment of the present disclosure.

FIG. 15B is a side cross-sectional view of the structures depicted in FIG. 15A, in which the cross section is through the center of the gate structure, i.e., perpendicular to the gate structure.

FIG. 16A is a side cross-sectional view depicting one embodiment of forming a first epitaxial semiconductor material for the source and drain regions of the semiconductor devices being formed in the first device region, in accordance with one embodiment of the present disclosure.

FIG. 16B is a side cross-sectional view of the structures depicted in FIG. 16A, in which the cross section is through the center of the gate structure.

DETAILED DESCRIPTION

Figure 1A:
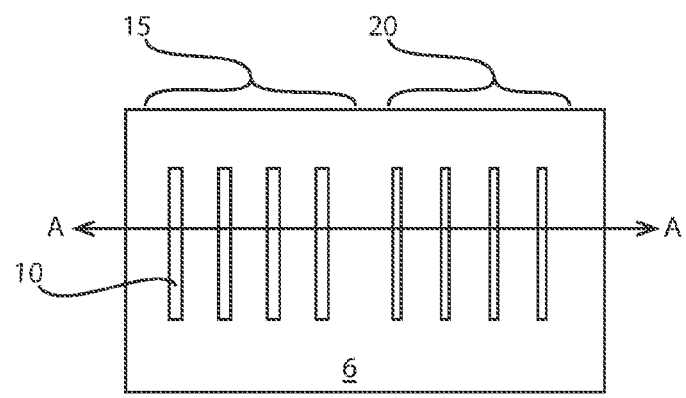
FIG. 1A is a top down view of a first plurality of fin structures in a first device region and a second plurality of fin structures in a second device region, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide a method for enabling the use of a single low-k gate structure spacer for forming the source and drain regions on the fin structures of both n-type and p-type semiconductor devices in a complementary metal oxide semiconductor (CMOS) device arrangement. Low-k gate structure spacers can be advantageous for reducing parasitic capacitance. For example, gate structures spacers have conventionally been made of silicon nitride, which has a relatively high dielectric constant value (i.e., a high k value) of, e.g., about 7-8. As a result of the transistor structure, the high-k silicon nitride spacers usually tend to increase the parasitic capacitance between the gate electrode and self-alighted contacts on source/drain regions of the transistor, which often reduces the switching speed of the transistor. Thus, low-k dielectric materials (e.g., k<6) are sometimes implemented to fabricate sidewall spacers in order to improve the transistor performance.

One example of a low-k dielectric that has been used for a spacer material is SiBCN, which has a dielectric constant on the order of approximately 5. In the interest of further decreasing the dielectric constant for spacer materials, SiOCN is being integrated into CMOS designed in accordance with the methods disclosed herein. For example, in some compositions, the dielectric constant of SiOCN may range from 2.8 to 3.5. In process flows employing spacers composed of SiBCN, selective epitaxial semiconductor growth for source and drain regions employed a silicon nitride liner that is wet chemically stripped selectively to SiBCN. It has been determined that CMOS process flows employing spacers composed of SiBCN are not applicable to similar process flows including spacers composed of SiOCN, because SiOCN does not have the same wet etch resistant qualities as SiBCN. For example, there is no ideal etch solution for stripping silicon nitride (which is used as a mask in SiBCN spacer process flows) from SiOCN.

In some embodiments, the methods and structures disclosed herein provide a process flow for CMOS device integration employing a single gate sidewall spacer of low-k SiOCN, which achieves equal n-type and p-type spacer thickness using a fin structure liner of an etch resistant material, such as hafnium and oxygen containing dielectrics, e.g., $HfO_x$. In some embodiments, the methods and structures provided herein eliminate the need for a silicon nitride cap layers, as used for etch selectivity in process flows employing SiBCN spacers. Further, although SiOCN is one example of a low-k dielectric suitable for gate sidewall spacers in accordance with the methods disclosed herein, the methods disclosed herein to not have to be employed with SiOCN exclusively, as other low-k dielectric materials are also suitable for the disclosed method. The methods disclosed herein may also decrease the aspect ratio challenges in etching spacers for fin containing structures using anisotropic etch processes, such as reactive ion etch. Further, because the methods disclosed herein require less etch steps, such as reactive ion etch and wet chemical etching, the processes provided herein reduce spacer slimming, which allows that the spacers be originally formed with a lesser width and/or thickness. Further, by removing the requirement of having the silicon nitride cap layers that are required of SiBCN process flows, the methods disclosed herein increase the process window in tight pitch areas.

In some embodiments, the methods and structures of the present disclosure use a fin liner composed of a high-k material, e.g., a hafnium and oxygen containing dielectric, such as hafnium oxide, to protect, i.e., block, p-type doped epitaxially formed semiconductor material from being forming in the n-type device region of a CMOS device arrangement. Thereafter, an oxidation layer is used to prevent, i.e., block, n-type doped epitaxially formed semiconductor material from being formed in the p-type device region of the CMOS device arrangement. This is only one example of how the methods and structures of the present disclosure enable CMOS device integration using a single spacer without requiring the use of SiBCN. Instead the methods used herein can employ other low-k compositions, such as SiOCN. In one embodiment, the high-k fin liner is removed before the gate structures are patterned. In another embodiment, the high-k fin liner is removed after the gate structure is patterned. In this embodiment, EG oxide is not required and the high-k liner may be used as an etch step, i.e., RIE stop, for forming components of the gate structure. In yet another embodiment, the high-k fin liner is removed after the spacer etch step, i.e., spacer RIE. In this embodiment, the high-k fin liner may protect both the fin structures for the n-type devices and the fin structures for the p-type devices during spacer etch, i.e., spacer RIE. Further details regarding the method and structures of the present disclosure are now described with reference to FIGS. 1A-21B.

Figure 1B:
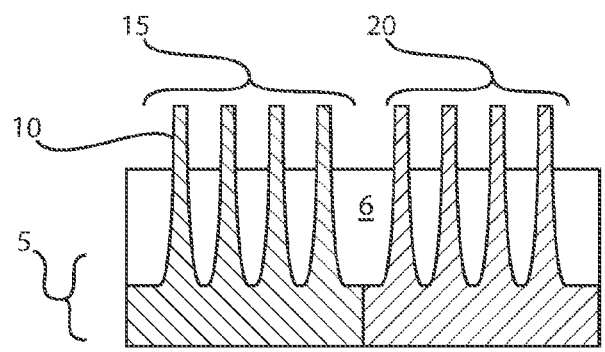
FIG. 1B is a side cross-sectional view along section line A-A of FIG. 1A.

FIGS. 1A and 1B depict one embodiment of a plurality of fin structures 10 in a first region 15 and a second region 20 of a semiconductor substrate 5. The first region 15 of the semiconductor substrate 5 may be further processed to provide at least one first conductivity type semiconductor device. The second region 20 of the semiconductor substrate 5 may be further processed to provide at least one second conductivity type semiconductor device. The term conductivity type denotes either a p-type conductivity or an n-type conductivity. In some embodiments, the fin structures 10 in the first device region 15 will be processed to provide p-type semiconductor devices, such as p-type Fin Field Effect Transistors (p-FinFETs), and the fin structures 10 in the second device region 20 will be processed to provide n-type semiconductor devices, such as n-type Fin Field Effect Transistors (n-FinFETs).

As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The fin structures 10 present in the first and second device regions 15, 20 are processed to provide FinFETs. A field effect transistor (FET) is a semiconductor device in which output current, i.e., source-drain current, is controlled by the voltage applied to a gate structure to the channel of a semiconductor device. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The source and drain regions of a finFET are typically formed on source and drain portions of the fin structures that are on opposing sides of the portion of the fin structure containing the channel region. In some examples, epitaxial semiconductor material provides portions of the source and drains regions of the FinFET, in which the epitaxial semiconductor material is formed on a portion of the source and drain portions of the fin structure.

The semiconductor material that provides the fin structures 10 may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. In one example, the fin structures 10 that are present in the first device region 15 are composed of silicon germanium (SiGe), and the fin structures 10 that are present in the second device region 20 are composed of silicon (Si).

The plurality of fin structures 10 may be formed from a semiconductor on insulator (SOI) substrate, or a bulk semiconductor substrate, using deposition photolithography and etch processes. In one embodiment, the patterning process used to define each of the fin structures 10 is a sidewall image transfer (SIT) process.

Each of the fin structures 10 may have a height ranging from 5 nm to 200 nm. In another embodiment, each of the fin structures 10 has a height ranging from 10 nm to 100 nm. In one example, each of the fin structures 10 has a height ranging from 20 nm to 50 nm. Each of the plurality of fin structures 10 may have a width of less than 20 nm. In another embodiment, each of the fin structures 10 has a width ranging from 3 nm to 8 nm. Although four fin structures 10 are present in each of the first and second device regions 15, 20 of the semiconductor substrate 5 that is depicted in FIGS. 1A and 1B, the present disclosure is not limited to only this example. It is noted that any number of fin structures 10 may be present in the first device region 15 and the second device region 20. The pitch separating adjacent fin structures 10 may range from 35 nm to 45 nm. In another example, the pitch separating adjacent fin structures 10 may range from 30 nm to 40 nm. It is noted that the above examples for pitch are provided for illustrative purposes only, and that any pitch may be used with the methods and structures of the present disclosure including a pitch below 30 nm.

In some embodiments, a dielectric material may be present filling the trenches that are separating the adjacent fin structures 10. The dielectric material may be an isolating dielectric 6 that provides for isolation between the adjacent fin structures 10. In some embodiments, the isolating dielectric 6 may be an oxide, such as silicon oxide. The isolating dielectric 6 may be formed by a deposition process, such as plasma enhanced chemical vapor deposition (PECVD).

Figure 2:
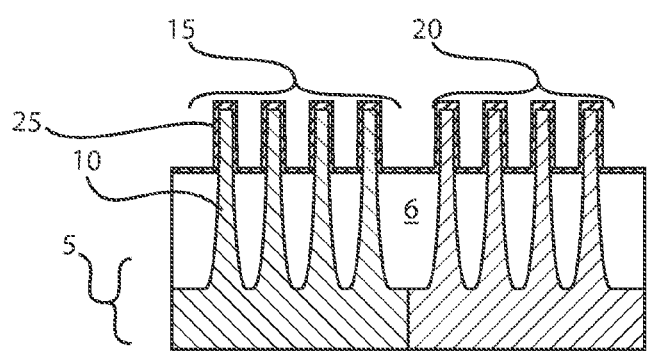
FIG. 2 is a side cross-sectional view depicting forming a high-k fin liner on the structure depicted in FIG. 1B, in accordance with one embodiment of the present disclosure.

FIG. 2 depicts one embodiment of forming a high-k dielectric fin liner 25 on the structure depicted in FIG. 1B. The term "high-k" as used to describe the material of the high-k dielectric fin liner 25 denotes a dielectric material having a dielectric constant greater than silicon oxide ($SiO_2$) at room temperature (20° C. to 25° C.) and atmospheric pressure (1 atm). For example, a high-k dielectric material of the high-k dielectric fin liner 25 may have a dielectric constant greater than 4.0. In another example, the high-k gate dielectric material of the high-k dielectric fin liner 25 has a dielectric constant greater than 7.0

The high-k dielectric material for the high-k dielectric fin liner 25 can include at least one metallic element. For example, the high-k dielectric fin liner 25 may be composed of at least hafnium and oxygen. In some embodiments, the high-k dielectric employed for the high-k fin liner 25 is selected from the group consisting of hafnium oxide ($HfO_2$), hafnium silicate (HfSiO), nitrided hafnium silicate (HfSiON), hafnium oxynitride ($HfO_xN_y$) and combinations thereof.

The high-k dielectric fin liner 25 may be blanket deposited on the fin structures 10 in the first device region 15 and the second device region 20, as well as the upper surface of the isolating dielectric 6 separating the adjacent fin structures 10. In some embodiments, the high-k dielectric fin liner 25 is formed on the upper and sidewall surfaces of the fin structures 10. The high-k dielectric fin liner 25 may be deposited using a conformal deposition process. The term "conformal" denotes a layer having a thickness that does not deviate from greater than or less than 30% of an average value for the thickness of the layer.

In one embodiment, the high-k dielectric fin liner 25 may be deposited by chemical vapor deposition (CVD). Variations of CVD processes suitable for depositing the high-k dielectric fin liner 25 include, but are not limited to, atmospheric pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof. In one embodiment, the thickness of the high-k dielectric fin liner 25 is greater than 0.8 nm. More typically, the high-k dielectric fin liner 25 has a thickness ranging from about 1.0 nm to about 6.0 nm.

Figure 3:
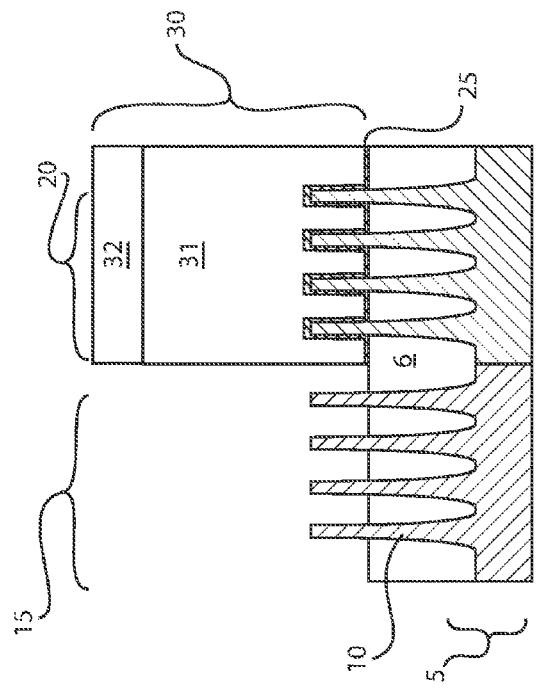
FIG. 3 is a side cross-sectional view depicting one embodiment of forming a block mask over the second device region, and removing the high-k fin liner from the first device region, in accordance with the present disclosure.

FIG. 3 depicts one embodiment of forming a block mask 30 over the second device region 20, and removing the high-k dielectric fin liner 25 from the first device region 15. Forming the block mask 30 may include blanket depositing an organic planarization layer (OPL) 31. The OPL 31 may include a photosensitive organic polymer or an etch type organic compound. Suitable photosensitive organic polymers include polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques. Above OPL 31 is an SiARC layer 32 followed by a photo mask (not shown) that will be used for block lithography to define the block mask 30.

The photo mask layer may be provided by a blanket layer of photoresist material that is formed utilizing a deposition process such as, for example, chemical vapor deposition, plasma enhanced chemical vapor deposition, evaporation or spin-on coating. The blanket layer of photoresist material is then patterned to provide the photo mask utilizing a lithographic process that may include exposing the photoresist material to a pattern of radiation and developing the exposed photoresist material utilizing a resist developer. Following the formation of the photo mask, an etching process may remove the unprotected portions of the SiARC layer 32 and the OPL layer 31, wherein the remaining portions of the SiARC layer 32 and the OPL layer 31 provide the block mask 30. The block mask 30 is present overlying the portion of the high-k dielectric fin liner 25 that is present in the second device region 20 while the portion of the high-k dielectric fin liner 35 that is present in the first device region 15 is exposed. Following patterning of the block mask 30, the photo mask is removed.

The exposed portion of the high-k dielectric fin liner 25 that is present in the first device region 15 is removed using a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. In one embodiment, the high-k dielectric fin liner 25 that is present in the first device region 15 is removed by an etch that is selective to at least the fin structures 10 and the block mask 30. The etch process for removing the high-k dielectric fin liner 25 may be an anisotropic etch, such as reactive ion etch, or an isotropic etch, such as a wet chemical etch.

Following removal of the portion of the high-k dielectric fin liner 25 from the first device region 15, the block mask 30 can be removed. For example, the block mask 30 may be removed using selective etching.

Figure 4:
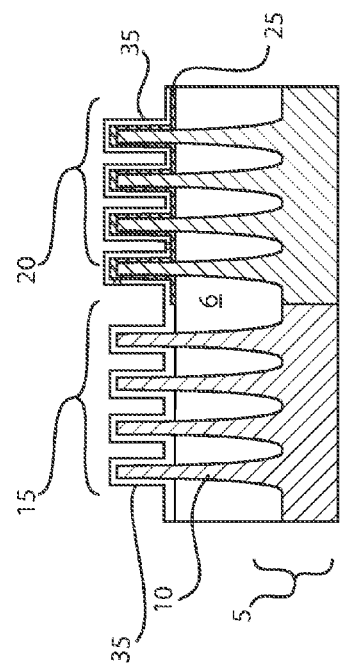
FIG. 4 is a side cross-sectional view depicting one embodiment of forming an oxide liner over the fin structures in the first device region and the second device region.

FIG. 4 depicts one embodiment of forming an oxide liner 35 over the fin structures 10 in the first device region 15 and the second device region 20. For example, the oxide liner 35 may be formed in direct contact with the fin structures 10 in the first device region 15, and in direct contact with the high-k dielectric fin liner 25 that is present in the second device region 20.

The oxide liner 35 may be composed of any oxide containing dielectric. For example, the oxide liner 35 may be composed of silicon oxide. It is noted that other materials have also been contemplated for the composition of the oxide liner 35. The oxide liner 35 may be formed using a deposition process, such as plasma enhanced chemical vapor deposition (PECVD), or may be formed using a growth process, such as thermal oxidation. The oxide liner 35 is typically a conformal layer. In one embodiment, the thickness of the oxide liner 35 is greater than 0.8 nm. More typically, the oxide liner 35 has a thickness ranging from about 1.0 nm to about 6.0 nm. It is noted that greater thicknesses than 6.0 nm may also be used for the oxide liner 35.

Figure 5A:
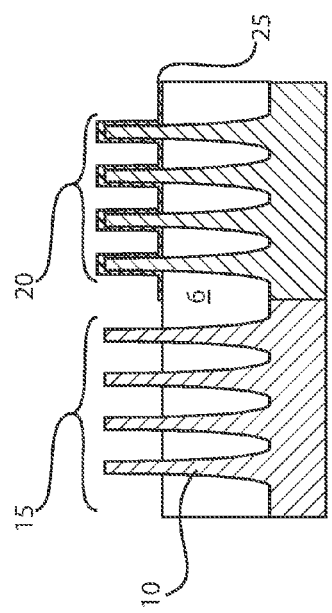
FIG. 5A is a side cross-sectional view depicting forming a gate structure on the channel portion of the fin structures in the first device region and the second device region, and removing a portion of the oxide layer that is not covered by the gate structure, in accordance with one embodiment of the present disclosure.
Figure 5B:
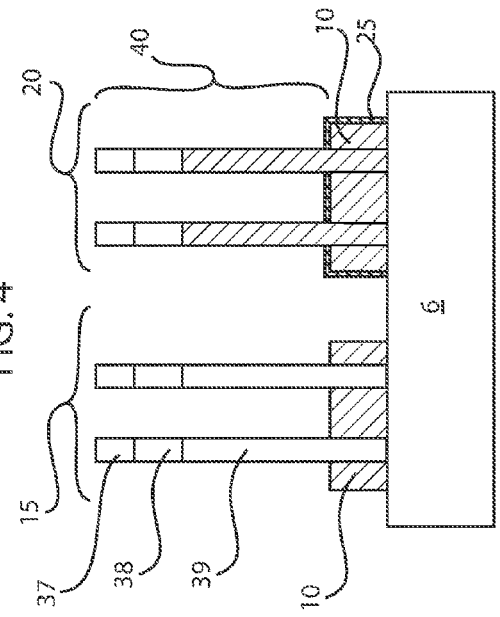
FIG. 5B is a side cross-sectional view of the structures depicted in FIG. 5A, in which the cross section is through the center of the gate structure, i.e., perpendicular to the gate structure.

FIGS. 5A and 5B depict one embodiment of forming a gate structure 40 on the channel portion of the fin structures 10 in the first device region 15 and the second device region 20, and removing a portion of the oxide layer 35 that is not covered by the gate structure 40. The "gate structure" functions to switch the semiconductor device from an "on" to "off" state, and vice versa. The gates structure 40 is formed on the channel region of the fin structures 10. The gate structure 40 typically includes at least a gate dielectric (not shown) that is present on the channel region of the fin structure 10, and a gate electrode 39 that is present on the gate dielectric. In one embodiment, the at least one gate dielectric layer includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer 13 has a thickness from 1 nm to 10 nm. In another embodiment, the at least one gate dielectric layer 13 has a thickness from 1 nm to 3 nm.

The conductive material of the gate electrode 39 may comprise polysilicon, SiGe, a silicide, a metal or a metal-silicon-nitride such as Ta—Si—N. Examples of metals that can be used as the gate electrode 14 include, but are not limited to, Al, W, Cu, and Ti or other like conductive metals. The layer of conductive material for the gate electrode 39 may be doped or undoped. If doped, an in-situ doping deposition process may be employed. Alternatively, a doped conductive material can be formed by deposition, ion implantation and annealing.

In the embodiment that is depicted in FIGS. 5A and 5B the gate structure 40 further includes a cap composed of a first layer 38 that is present atop the gate conductor 39 of a nitride, such as silicon nitride, and a second layer 37 of an oxide, such as silicon oxide, that is present atop the first layer 38. It is noted that other cap configurations are equally suitable for the present disclosure.

The gate structure 40 may be formed by using a deposition method, such as a chemical vapor deposition method and/or a physical vapor deposition (PVD), to deposit the material layers for the at least one gate dielectric layer and the at least one gate electrode followed by photolithography and etch processing. In some embodiments, the cap composed of the first layer 38 and the second layer 37 provides a hardmask as part of the photolithography and etch processing used to define the geometry of the gate structure 40. The gate structures may also be formed using sidewall image transfer (SIT).

FIGS. 5A and 5B also depict stripping the oxide liner 35. The oxide liner 35 is stripped after forming the gate structure 40. Therefore, the entirety of the oxide liner 35 may be removed with the exception of the portion of the oxide liner 35 that is positioned under the gate structure 40. In some embodiments, the oxide liner 35 is removed by an etch that is selective to the fin structures 10. The oxide liner 35 may be removed by a wet chemical etch. In other examples, the oxide liner 35 can be removed using reactive ion etch.

Figure 6A:
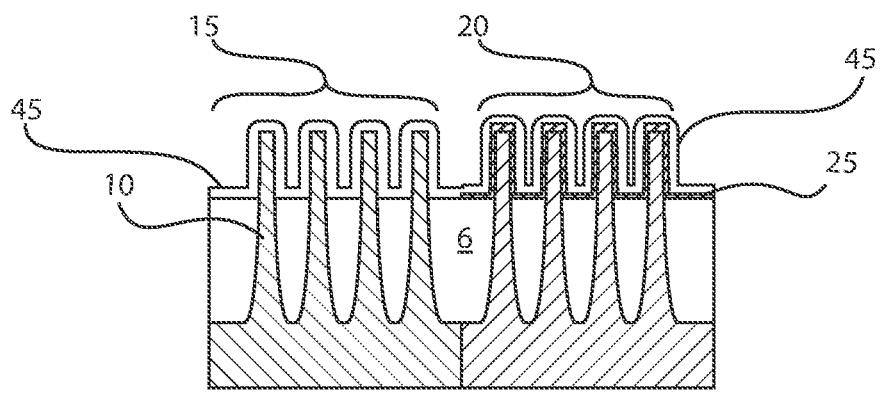
FIG. 6A is a side cross-sectional view depicting depositing a low-k dielectric material layer for forming a low-k dielectric gate sidewall spacer, in accordance with one embodiment of the present disclosure.
Figure 6B:
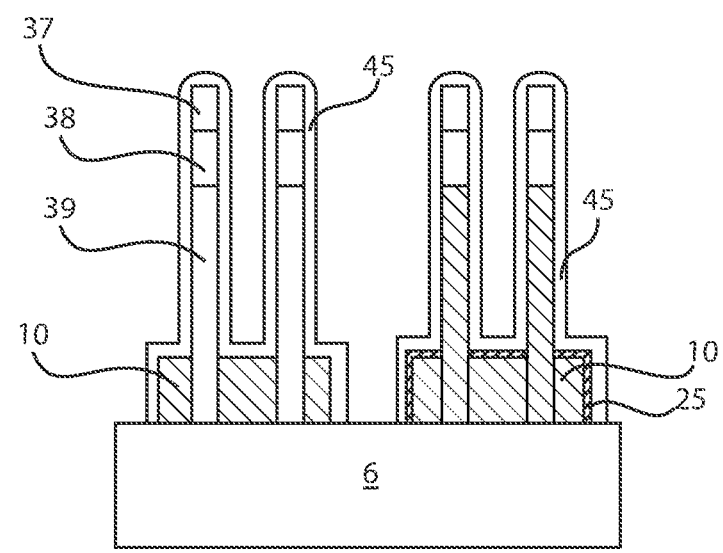
FIG. 6B is a side cross-sectional view of the structures depicted in FIG. 6A, in which the cross section is through the center of the gate structure i.e., perpendicular to the gate structure.

FIGS. 6A and 6B depict one embodiment of forming a low-k dielectric layer 45 composed of silicon, carbon, oxygen and nitrogen on at least the gate structures 40 and the fin structures 10 in the first device region 15 and the second device region 20. The low-k dielectric layer 45 provides the low-k gate sidewall spacers that are formed on the sidewalls of the gate structures 40. The low-k sidewalls spacers are a single spacer for each of the gate structures 40 in the first device region 15 and the second device region 20. As will be described in greater detail below, the low-k sidewall spacers in the first device region 15 have the same dimensions, e.g., width, as the low-k spacers in the second device region 20.

A low-k dielectric material as used in the low-k dielectric layer 45 may have a dielectric constant that is less than 4.0, e.g., 3.9. In one embodiment, the low-k material that provides the outer spacer layer 25 may have a dielectric constant ranging from 1.0 to 3.5. In another embodiment, the low-k material that provides the outer spacer layer 25 may have a dielectric constant ranging from 1.75 to 3.2.

One examples of a material suitable for the low-k materials for the low-k dielectric layer 45 may include silicon oxycarbonitride (SiOCN). Although silicon oxycarbonitride (SiOCN) is used in the present example, other low-k materials that may also be used for the low-k dielectric layer 45 may include fluorine doped silicon dioxide, carbon doped silicon dioxide, porous silicon dioxide, porous carbon doped silicon dioxide, organosilicate glass (OSG), diamond-like carbon (DLC) and combinations thereof.

In some embodiments, the low-k dielectric layer 45 may be conformally deposited using chemical vapor deposition (CVD). Variations of CVD processes suitable for forming the first dielectric layer include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In some embodiments, the low-k dielectric layer 45 may have a thickness ranging from 5 nm to 30 nm. In another embodiment, the low-k dielectric layer 45 may have a thickness ranging from 7 nm to 15 nm.

FIGS. 7A and 7B depict etching the low-k dielectric material layer 45 to form the low-k dielectric gate sidewall spacer 50. In some embodiments, an etch process is used to remove the portions of the low-k dielectric material layer 45 that are not present on the sidewalls of the gate structures 40. The remaining portions of the low-k dielectric material layer 45 that are present on the sidewalls of the gate structures 40 provide the low-k dielectric gate sidewall spacers 40. In some embodiments, removing the low-k dielectric material layer 45 from the fin structures 10 in the second device region 20 exposes the high-k dielectric fin liner 25 that is present on the fin structures 10. Therefore, in some embodiments, the etch chemistry for etching the low-k dielectric material layer 45 may be selective to the high-k dielectric fin liner 25. In some embodiments, removing the low-k dielectric material layer 45 from the fin structures 10 in the first device region 15 exposed the exterior surfaces of the fin structures 10. Therefore, in some embodiments, the etch chemistry for etching the low-k dielectric material layer 45 may be selective to the fin structures 10.

In some embodiments, the etch process for etching the low-k dielectric material layer 45 and forming the low-k dielectric gate sidewall spacers 50 includes an anisotropic etch. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiments, the etch process for etching the low-k dielectric material layer 45 is a timed etch or employs end point detection to determine when the etch process is to be terminated.

In some embodiments, the etch process may continue until the portions of the low-k dielectric material layer 45 is removed from the upper surfaces of the gate structure 40, i.e., removed from the upper surface of the second layer 37 of the dielectric cap, and is removed from the fin structures 10, and the isolation regions 6 between the fin structures 10. The remaining portions of the low-k dielectric material 45 are present on the sidewalls of the gate structures 40, and provides the low-k dielectric gate sidewall spacers 50. The width of low-k dielectric gate sidewalls spacers 50 in the first device region 15 is substantially equal to the width of the low-k dielectric gate sidewall spacers 50 in the second device region 20. In one embodiment, the width of the low-k dielectric gate sidewall spacers ranges from 1 nm to 10 nm. In another embodiment, the width of the low-k dielectric gate sidewall spacers ranges from 2 nm to 5 nm.

FIGS. 8A and 8B depict one embodiment of forming a first epitaxial semiconductor material 50 for the source and drain regions of the semiconductor devices being formed in the first device region 15. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces. Therefore, epitaxial semiconductor material is not formed on the high-k dielectric fin liner 25 covering the fin structures 10 in the second device region 20.

The first epitaxial semiconductor material 50 formed on the fin structures 10 of Fin Field Effect Transistors (FinFET) may provide a component of the source and drain regions of the FinFETs in the first device region 15. In some embodiments, the FinFETs in the first device region 15 are a first conductivity, and the FinFETs being formed in the second device region 20 are a second conductivity. For example, the first epitaxial material 50 may be p-type doped epitaxial semiconductor material to provide the p-type source regions and p-type drain regions of a p-type FinFET in the first device region 15, wherein the second device region 20 may be subsequently processed to provide n-type FinFETs.

In some embodiments, the first epitaxial semiconductor material 50 that provides the p-type source and drain regions may be composed of silicon (Si), germanium (Ge), silicon germanium (SiGe), or a combination thereof. In one example, the p-type source and drain regions are provided by silicon germanium (SiGe) epitaxial semiconductor material 50.

In one embodiment, a number of different sources may be used for the epitaxial deposition of the first epitaxial semiconductor material 50. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the epitaxial semiconductor material 50 of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition may result in crystal defects and film cracking. In one embodiment, the thickness of epitaxial semiconductor material 50 may range from 10 nm to 100 nm. In another embodiment, the thickness of epitaxial semiconductor material 50 may range from 40 nm to 60 nm.

The first epitaxial semiconductor material 50 may be in situ doped to a p-type conductivity. The term "in situ" denotes that a dopant, e.g., n-type or p-type dopant, is introduced to the base semiconductor material, e.g., silicon or silicon germanium, during the formation of the base material. For example, an in situ doped first epitaxial semiconductor material 50 may introduce p-type dopants to the material being formed during the epitaxial deposition process that includes p-type source gasses. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source may include diborane ($B_2H_6$).

Referring to FIGS. 8A and 8B, in some embodiments, the epitaxial deposition process for forming the first epitaxial semiconductor material 50 may continue until the first epitaxial semiconductor material 50 that is formed on adjacent fin structures 10 contact one another to form merged epitaxial semiconductor material.

Referring to FIGS. 9A and 9B, following formation of the first epitaxial semiconductor material 50 in the first device region 15, an oxide liner 55 is formed on the epitaxial semiconductor material 50. The oxide liner 55 is formed on the entirety of the exposed surfaces of the first epitaxial semiconductor material 50. For example, the oxide liner 55 may be formed using a thermal oxidation process. In some embodiments, in which the first epitaxial semiconductor material 50 is composed of germanium, the thermal oxidation process applied to the first epitaxial semiconductor 50 produces a germanium containing oxide for the oxide liner 55. The oxide liner 55 is formed on the entirety of the exterior surfaces of the first epitaxial semiconductor material 50. The oxide liner 55 that is formed on the exterior surface of the first epitaxial semiconductor material 50 obstructs the subsequently formed second first epitaxial semiconductor material 60 provides the source and drain regions in the second device region 20 from being formed in the first device region 15. In some embodiments, the oxide liner 55 has a thickness ranging from 1 nm to 10 nm. In another embodiment, the oxide liner 55 has a thickness ranging from 2 nm to 5 nm. It is noted that greater thicknesses for the oxide liner 55 are also suitable for use with the present disclosure.

FIGS. 10A and 10B illustrate removing the high-k dielectric fin liner 25 from the second device region 20, which exposes the exterior surfaces of the fin structures 10 in the second device region 20. The high-k dielectric fin liner 25 may be removed using a selective etch process. For example, the high-k dielectric fin liner 25 can be removed using an etch that is selective to the fin structures 10 in the second device region 20, and the oxide liner 55 in the first device region 10.

FIGS. 11A and 11B depict one embodiment of forming a second epitaxial semiconductor material 60 for the source and drain regions of the semiconductor devices being formed in the second device region 20. As noted above, the semiconductor devices in the second device region 20 have an opposite conductivity type as the semiconductor devices in the first device region 15. In the present example, the first device region 10 has been processed to provide n-type FinFET. Therefore, the second epitaxial semiconductor material 60 that is formed on the fin structures 10 in the second device region 20 typically has an n-type conductivity in order to provide n-type semiconductor devices, such as n-FinFETs. As noted above, the oxide liner 55 obstructs the second epitaxial semiconductor material 60 from being formed on the first epitaxial semiconductor material 50 that is present in the first device region 15.

In some embodiments, the second epitaxial semiconductor material 60 is composed of silicon (Si) that is in-situ doped with an n-type dopant to provide the n-type source and drain regions for the n-type conductivity semiconductor devices. In other embodiments, the second epitaxial semiconductor material 60 may be composed of silicon doped with carbon (Si:C). It is noted that the epitaxial deposition process for forming the second epitaxial semiconductor material 60 is similar to the epitaxial deposition process that has been described above for forming the first epitaxial semiconductor material 50. Therefore, the above description of epitaxial deposition and the source gasses for epitaxial deposition that have been described above with reference to FIGS. 8A and 8B for forming the first epitaxial semiconductor suitable is suitable for describing the second epitaxial semiconductor material 60 depicted in FIGS. 11A and 11B.

The second epitaxial semiconductor material 60 may be n-type doped. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous. The second epitaxial semiconductor material 60 may be in situ doped. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine ($(CH_3)_3P$), dimethylphosphine ($(CH_3)_2PH$), triethylphosphine ($(CH_3CH_2)_3P$) and diethylphosphine ($(CH_3CH_2)_2PH$). It is noted that epitaxial deposition process may be continued until merged epitaxial semiconductor material is formed on the fin structures in the second device region 20.

In some embodiments, the above described method provides p-type FinFETs in a first device region and n-type FinFETs in a second device region. A gate structure may be formed on a channel portion for each of the fin structures for each of the p-type and n-type FinFETs. Gate sidewall spacers of a low-k dielectric material, such as SiCON, is formed on the gate structures for each of the n-type FinFETs and the p-type FinFETs. The gate sidewall spacers for each of the n-type and p-type FinFETs have substantially the same width. The gate sidewall spacers for the n-type finFETs may include a high-k dielectric fin liner material present at the interface of the gate sidewall spacers, and the fin structures. The source and drain regions for the p-type FinFETs are typically composed of an epitaxial germanium containing material, such as silicon germanium. The exterior surface of the epitaxial germanium containing material may be oxidized. The source and drain regions of the n-type FinFETs may be composed of silicon epitaxial material, which typically does not include the oxidized surface that is present on the germanium containing epitaxial semiconductor material that provides the source and drain regions of the p-type FinFETs.

FIGS. 12A-17B depict another embodiment of the present disclosure. In the embodiment depicted in FIGS. 12A-17B, the high-k dielectric fin liner 25 is removed from the first device region 10 after patterning the gate structure 40. In this embodiment, the oxide liner 55 that is employed in the embodiment described in FIGS. 1-11B may be omitted.

Additionally, the high-k dielectric fin liner 25 may function as an etch stop during patterning of the gate structures 40.

FIGS. 12A and 12B depict forming a gate structure 40 on the fin structures 10 of the first device region 15 and the second device region 20 of the structure depicted in FIG. 2. The gate structure 40 depicted in FIGS. 12A and 12B is similar to the gate structure 40 that has been described above with reference to FIGS. 5A and 5B. Therefore, the above description of the gate structure 40 provided for FIGS. 5A and 5B is equally applicable to the gate structure 40 depicted in FIGS. 12A and 12B. The high-k dielectric fin liner 25 can function as an etch stop during patterning of the gate structures 40.

Figure 13A:
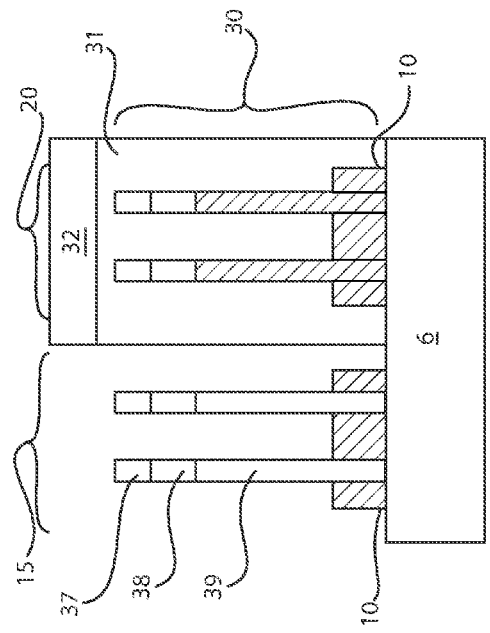
FIG. 13A is a side cross-sectional view depicting forming a block mask over the second device region, and removing the high-k dielectric fin liner from the first device region.
Figure 13B:
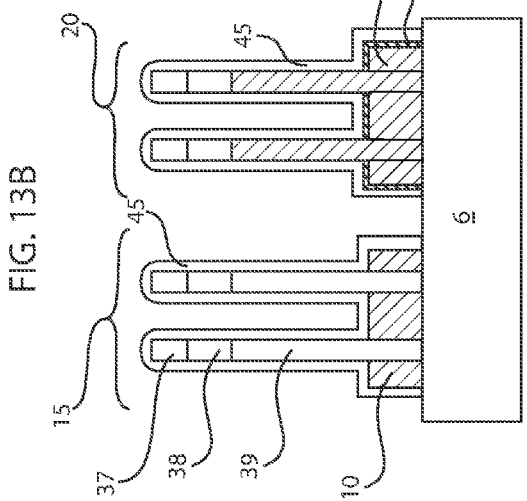
FIG. 13B is a side cross-sectional view of the structures depicted in FIG. 13A, in which the cross section is through the center of the gate structure, i.e., perpendicular to the gate structure.

FIGS. 13A and 13B depict forming a block mask 30 over the second device region 20 including the fin structures 10 and gate structure 40 present therein, and removing the high-k dielectric fin liner 25 from the first device region 15. The block mask 30 depicted in FIGS. 13A and 13B has been described above with reference to FIG. 3. The exposed portions of the high-k dielectric fin liner 25 that are not protected by the block mask 30 are removed from the first device region 15 using a selective etch process similar to the selective etch process that has been described above for removing the high-k dielectric fin liner 25 in FIG. 3. Following selective etching of the high-k dielectric fin liner 25, the block mask 30 may be removed.

Figure 14A:
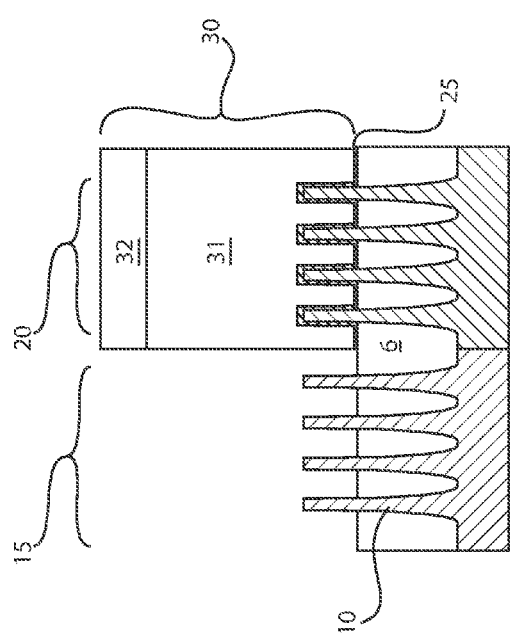
FIG. 14A is a side cross-sectional view depicting depositing a low-k dielectric material layer for forming a low-k dielectric gate sidewall spacer, in accordance with one embodiment of the present disclosure.
Figure 14B:
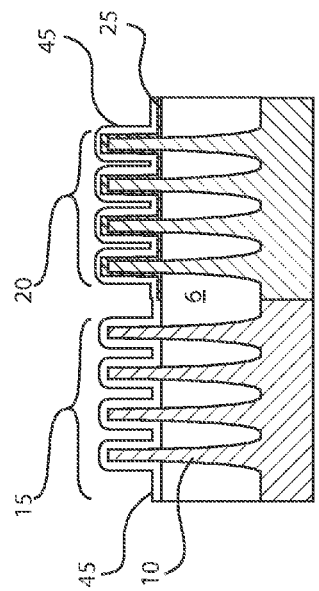
FIG. 14B is a side cross-sectional view of the structures depicted in FIG. 14A, in which the cross section is through the center of the gate structure, i.e., perpendicular to the gate structure.

FIGS. 14A and 14B depict depositing a low-k dielectric material layer 45 for forming low-k dielectric gate sidewall spacers 50. The low-k dielectric material layer 45 depicted in FIGS. 14A and 14B is similar to the low-k dielectric material layer 45 that has been described above with reference to FIGS. 6A and 6B. Therefore, the above description of the low-k dielectric material layer 45 provided for FIGS. 6A and 6B is equally applicable to the low-k dielectric material layer 45 depicted in FIGS. 6A and 6B. For example, the low-k dielectric material layer 45 may be composed of SiOCN.

FIGS. 15A and 15B depict etching the low-k dielectric material layer 45 to form the low-k dielectric gate sidewall spacer 50. In some embodiments, an etch process is used to remove the portions of the low-k dielectric material layer 45 that are not present on the sidewalls of the gate structures 40. The remaining portions of the low-k dielectric material layer 45 that are present on the sidewalls of the gate structures 40 provide the low-k dielectric gate sidewall spacers 50. In some embodiments, removing the low-k dielectric material layer 45 from the fin structures 10 in the second device region 20 exposes the high-k dielectric fin liner 25 that is present on the fin structures 10. Therefore, in some embodiments, the etch chemistry for etching the low-k dielectric material layer 45 may be selective to the high-k dielectric fin liner 25. In some embodiments, removing the low-k dielectric material layer 45 from the fin structures 10 in the first device region 15 exposed the exterior surfaces of the fin structures 10. Therefore, in some embodiments, the etch chemistry for etching the low-k dielectric material layer 45 may be selective to the fin structures 10.

In some embodiments, the etch process for etching the low-k dielectric material layer 45 and forming the low-k dielectric gate sidewall spacers 50 includes an anisotropic etch. The anisotropic etch may include reactive-ion etching (RIE). Other examples of anisotropic etching that can be used at this point of the present disclosure include ion beam etching, plasma etching or laser ablation.

In some embodiments, the etch process may continue until the portions of the low-k dielectric material layer 45 is removed from the upper surfaces of the gate structure 40, i.e., removed from the upper surface of the second layer 37 of the dielectric cap, and is removed from the fin structures 10, and the isolation regions 6 between the fin structures 10. The remaining portions of the low-k dielectric material 45 are present on the sidewalls of the gate structures 40, and provides the low-k dielectric gate sidewall spacers 50. The width of low-k dielectric gate sidewalls spacers 50 in the first device region 15 is substantially equal to the width of the low-k dielectric gate sidewall spacers 50 in the second device region 20. In one embodiment, the width of the low-k dielectric gate sidewall spacers ranges from 1 nm to 10 nm. In another embodiment, the width of the low-k dielectric gate sidewall spacers ranges from 2 nm to 5 nm.

FIGS. 16A and 16B depict one embodiment of forming a first epitaxial semiconductor material 50 for the source and drain regions of the semiconductor devices being formed in the first device region 15. The first epitaxial semiconductor material 50 that is formed on the fin structures 10 is obstructed from being formed on the fin structures in the second device region 20 by the high-k dielectric fin liner 25 present thereon. The first epitaxial semiconductor material 50 that is depicted in FIGS. 16A and 16B is similar to the first epitaxial semiconductor material 50 that has been described above with reference to FIGS. 8A and 8B. Therefore, the above description of the first epitaxial semiconductor material 50 provided for FIGS. 8A and 8B is equally applicable to the first epitaxial semiconductor material 50 depicted in FIGS. 16A and 16B. For example, the first epitaxial semiconductor material 50 may be composed of p-type conductivity germanium containing epitaxial semiconductor material, such as silicon germanium.

Following formation of the first epitaxial semiconductor material 50, the exterior surfaces of the first epitaxial semiconductor material are oxidized to provide an oxide liner 55. The oxide liner 55 is formed on the entirety of the exposed surfaces of the first epitaxial semiconductor material 50. For example, the oxide liner 55 may be formed using a thermal oxidation process. In some embodiments, in which the first epitaxial semiconductor material 50 is composed of germanium, the thermal oxidation process applied to the first epitaxial semiconductor 50 produces a germanium containing oxide for the oxide liner 55. The oxide liner 55 is formed on the entirety of the exterior surfaces of the first epitaxial semiconductor material 50. The oxide liner 55 that is formed on the exterior surface of the first epitaxial semiconductor material 50 obstructs the subsequently formed second first epitaxial semiconductor material 60 provides the source and drain regions in the second device region 20 from being formed in the first device region 15. In some embodiments, the oxide liner 55 has a thickness ranging from 1 nm to 10 nm. In another embodiment, the oxide liner 55 has a thickness ranging from 2 nm to 5 nm.

Following the formation of the oxide liner 55, the high-k dielectric fin liner 25 is removed from the second device region 20, which exposes the exterior surfaces of the fin structures 10 in the second device region 20. The high-k dielectric fin liner 25 may be removed using a selective etch process. For example, the high-k dielectric fin liner 25 can be removed using an etch that is selective to the fin structures 10 in the second device region 20, and the oxide liner 55 in the first device region 10.

Figure 17A:
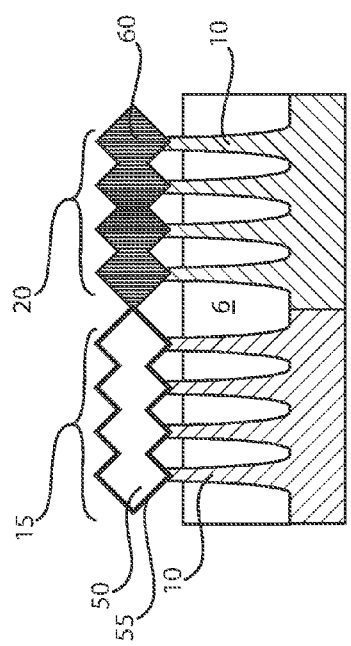
FIG. 17A is a side cross-sectional view depicting one embodiment of forming a second epitaxial semiconductor material for the source and drain regions of the semiconductor devices being formed in the second device region, in accordance with one embodiment of the present disclosure.
Figure 17B:
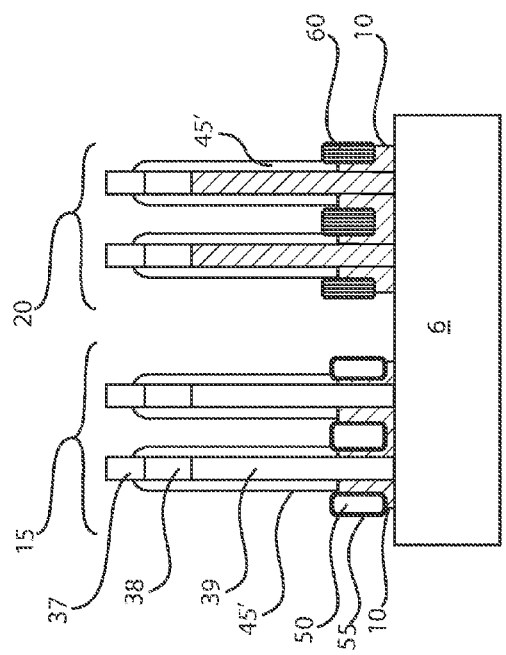
FIG. 17B is a side cross-sectional view of the structures depicted in FIG. 17A, in which the cross section is through the center of the gate structure, i.e., perpendicular to the gate structure.

FIGS. 17A and 17B depict one embodiment of forming a second epitaxial semiconductor material 60 for the source and drain regions of the semiconductor devices being formed in the second device region 20. As noted above, the semiconductor devices in the second device region 20 have an opposite conductivity type as the semiconductor devices in the first device region 15. In the present example, the first device region 10 has been processed to provide n-type FinFET. Therefore, the second epitaxial semiconductor material 60 that is formed on the fin structures 10 in the second device region 20 typically has an n-type conductivity in order to provide n-type semiconductor devices, such as n-FinFETs. As noted above, the oxide liner 55 obstructs the second epitaxial semiconductor material 60 from being formed on the first epitaxial semiconductor material 50 that is present in the first device region 15.

In some embodiments, the second epitaxial semiconductor material 60 is composed of silicon (Si) that is in-situ doped with an n-type dopant to provide the n-type source and drain regions for the n-type conductivity semiconductor devices. In other embodiments, the second epitaxial semiconductor material 60 may be composed of silicon doped with carbon (Si:C). The second epitaxial semiconductor material 60 may be n-type doped. In some embodiments, the above described method provides p-type FinFETs in a first device region and n-type FinFETs in a second device region.

FIGS. 18A-21B depict another embodiment of the present disclosure. In the embodiment depicted in FIGS. 18A-21B, the high-k dielectric fin liner 25 is removed after the etch steps that define the low-k dielectric gate sidewall spacer 50. In this embodiment, the high-k dielectric fin liner 25 protects the fin structures 10 in the first device region 15 and the second device region 20 during the etch processes that define the low-k dielectric gate sidewall spacer 50.

Figure 18A:
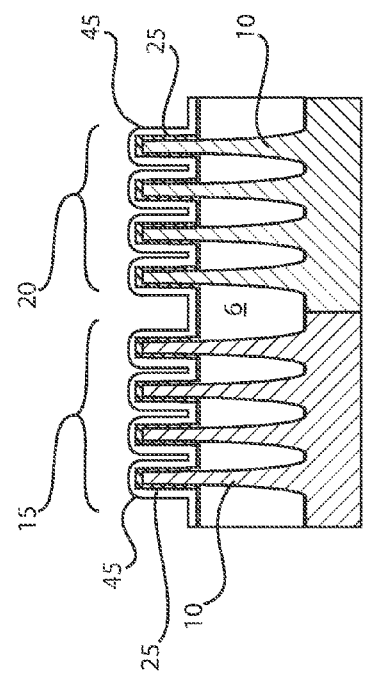
FIG. 18A is a side cross-sectional view depicting depositing a low-k dielectric material layer for forming a low-k dielectric gate sidewall spacer on the structure depicted in FIG. 12A, in accordance with one embodiment of the present disclosure.
Figure 18B:
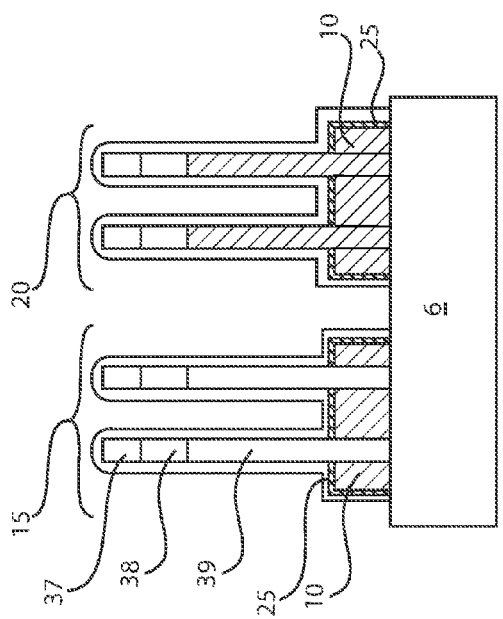
FIG. 18B is a side cross-sectional view of the structures depicted in FIG. 18A, in which the cross section is through the center of the gate structure, i.e., perpendicular to the gate structure.

FIGS. 18A and 18B depict depositing a low-k dielectric material layer 45 for forming a low-k dielectric gate sidewall spacer 50 on the structure depicted in FIGS. 12A and 12B. The low-k dielectric material layer 45 depicted in FIGS. 18A and 18B is similar to the low-k dielectric material layer 45 that has been described above with reference to FIGS. 6A and 6B. Therefore, the above description of the low-k dielectric material layer 45 provided for FIGS. 6A and 6B is equally applicable to the low-k dielectric material layer 45 depicted in FIGS. 6A and 6B. For example, the low-k dielectric material layer 45 may be composed of SiOCN.

Figure 19A:
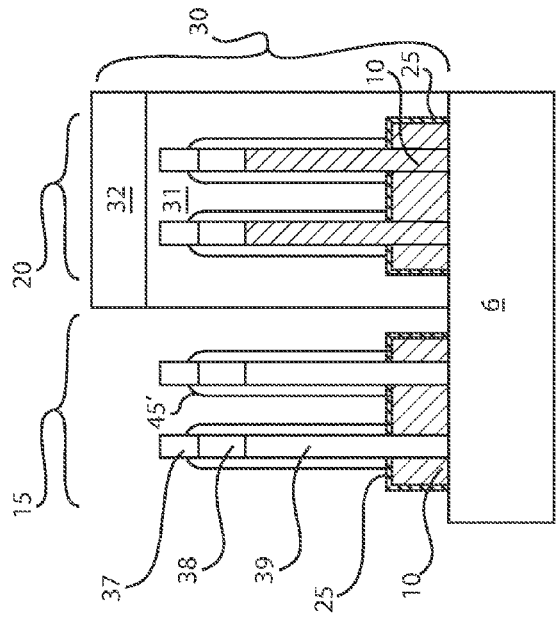
FIG. 19A is a side cross-sectional view depicting forming a block mask 30 over the second device region after etching the low-k dielectric material layer to form the low-k dielectric gate sidewall spacer, and removing the high-k dielectric fin liner from the first device region, in accordance with one embodiment of the present disclosure.
Figure 19B:
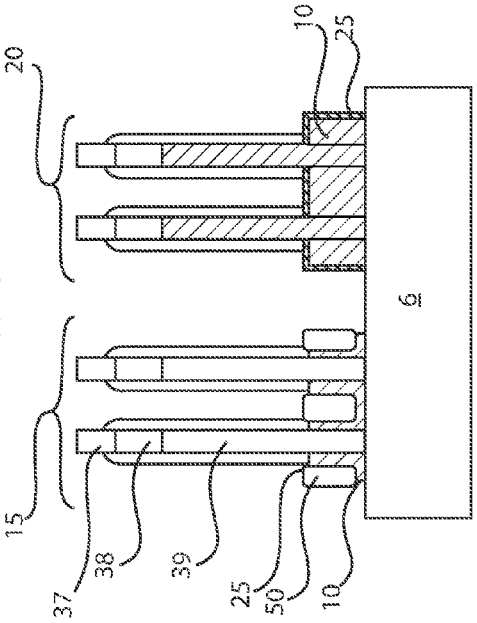
FIG. 19B is a side cross-sectional view of the structures depicted in FIG. 19A, in which the cross section is through the center of the gate structure. i.e., perpendicular to the gate structure.

FIGS. 19A and 19B depict forming a block mask 30 over the second device region 20 after etching the low-k dielectric material layer 45 to form the low-k dielectric gate sidewall spacer 50, and removing the high-k dielectric fin liner 25 from the first device region 15. Etching the low-k dielectric layer 45 to form the low-k dielectric gate sidewall spacer 50 has been described above with reference to FIGS. 7A and 7B. Forming the block mask 30 has been described above with reference to FIGS. 13A and 13B. The exposed portion of the high-k dielectric fin liner 25 that may be removed using a selective etch process while the portion of the high-k dielectric fin liner 25 that is present in the second device region 20 is protected by the block mask 30, and remains. For example, the high-k dielectric fin liner 25 can be removed using an etch that is selective to the fin structures 10 in the first device region 15. After removing the high-k dielectric fin liner 25 from the fin structures 10 in the first device region 10, the block mask 30 may be removed.

Figure 20A:
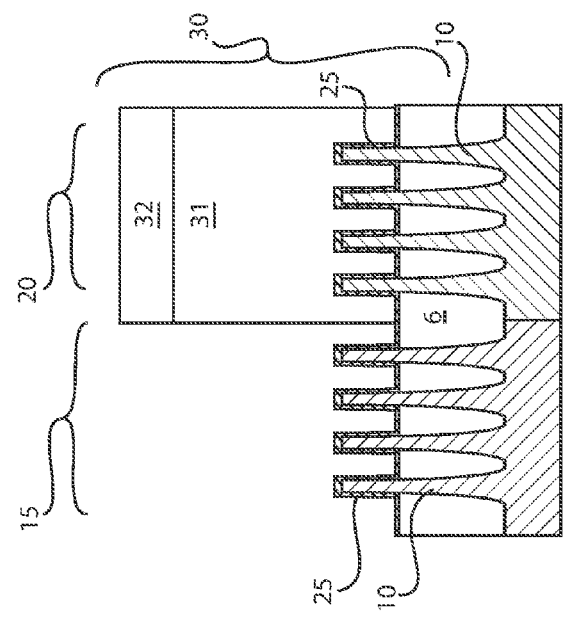
FIG. 20A is a side cross-sectional view depicting one embodiment of forming a first epitaxial semiconductor material for the source and drain regions of the semiconductor devices being formed in the first device region of FIGS. 19A and 19B, in accordance with one embodiment of the present disclosure.
Figure 20B:
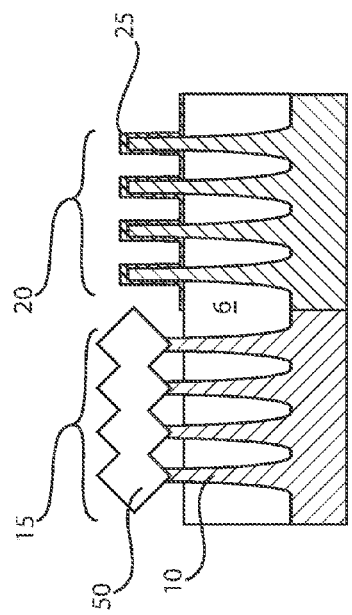
FIG. 20B is a side cross-sectional view of the structures depicted in FIG. 20A, in which the cross section is through the center of the gate structure, i.e., perpendicular to the gate structure.

FIGS. 20A and 20B depict one embodiment of forming a first epitaxial semiconductor material 50 for the source and drain regions of the semiconductor devices being formed in the first device region 15 of FIGS. 19A and 19B. The first epitaxial semiconductor material 50 that is formed on the fin structures 10 is obstructed from being formed on the fin structures 10 in the second device region 20 by the high-k dielectric fin liner 25 present thereon. The first epitaxial semiconductor material 50 that is depicted in FIGS. 20A and 20B is similar to the first epitaxial semiconductor material 50 that has been described above with reference to FIGS. 8A and 8B. Therefore, the above description of the first epitaxial semiconductor material 50 provided for FIGS. 8A and 8B is equally applicable to the first epitaxial semiconductor material 50 depicted in FIGS. 20A and 20B. For example, the first epitaxial semiconductor material 50 may be composed of p-type conductivity germanium containing epitaxial semiconductor material, such as silicon germanium.

Following formation of the first epitaxial semiconductor material 50, the exterior surfaces of the first epitaxial semiconductor material are oxidized to provide an oxide liner 55. The oxide liner 55 is formed on the entirety of the exposed surfaces of the first epitaxial semiconductor material 50. For example, the oxide liner 55 may be formed using a thermal oxidation process. In some embodiments, in which the first epitaxial semiconductor material 50 is composed of germanium, the thermal oxidation process applied to the first epitaxial semiconductor material 50 produces a germanium containing oxide for the oxide liner 55. The oxide liner 55 that is formed on the exterior surface of the first epitaxial semiconductor material 50 obstructs the subsequently formed second first epitaxial semiconductor material 60 provides the source and drain regions in the second device region 20 from being formed in the first device region 15. In some embodiments, the oxide liner 55 has a thickness ranging from 1 nm to 10 nm. In another embodiment, the oxide liner 55 has a thickness ranging from 2 nm to 5 nm.

Following the formation of the oxide liner 55, the high-k dielectric fin liner 25 is removed from the second device region 20, which exposes the exterior surfaces of the fin structures 10 in the second device region 20. The high-k dielectric fin liner 25 may be removed using a selective etch process. For example, the high-k dielectric fin liner 25 can be removed using an etch that is selective to the fin structures 10 in the second device region 20, and the oxide liner 55 in the first device region 10.

Figure 21A:
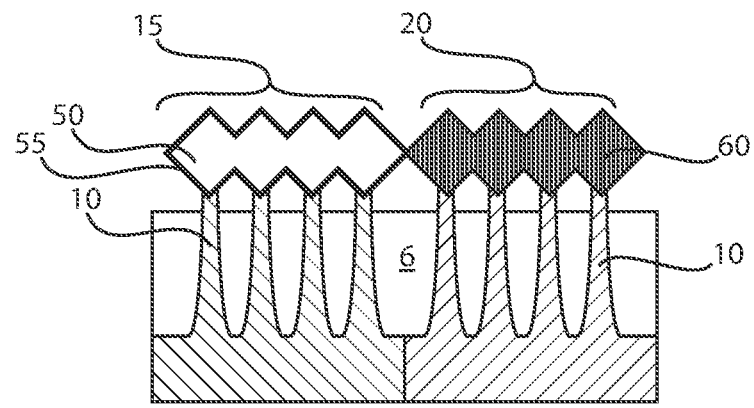
FIG. 21A is a side cross-sectional view depicting forming an oxide liner on the first epitaxial semiconductor material, removing the high-k dielectric fin liner from the fin structures in the second device region, and forming a second epitaxial semiconductor material on the fin structures in the second device region, in accordance with the present disclosure.
Figure 21B:
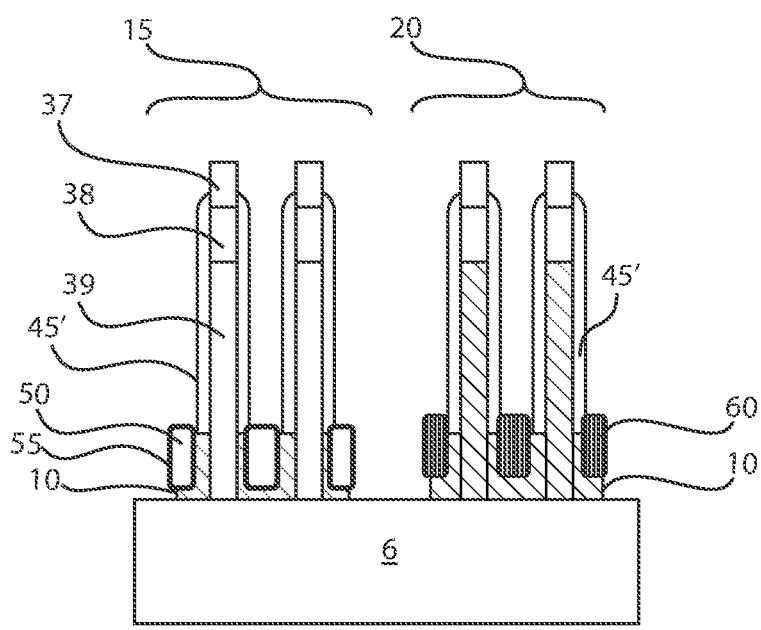
FIG. 21B is a side cross-sectional view of the structures depicted in FIG. 21A, in which the cross section is through the center of the gate structure, i.e., perpendicular to the gate structure.

FIGS. 21A and 21B depict one embodiment of forming a second epitaxial semiconductor material 60 for the source and drain regions of the semiconductor devices being formed in the second device region 20. As noted above, the oxide liner 55 obstructs the second epitaxial semiconductor material 60 from being formed on the first epitaxial semiconductor material 50 that is present in the first device region 15.

In some embodiments, the second epitaxial semiconductor material 60 is composed of silicon (Si) that is in-situ doped with an n-type dopant to provide the n-type source and drain regions for the n-type conductivity semiconductor devices. In other embodiments, the second epitaxial semiconductor material 60 may be composed of silicon doped with carbon (Si:C). The second epitaxial semiconductor material 60 may be n-type doped. In some embodiments, the above described method provides p-type FinFETs in a first device region and n-type FinFETs in a second device region.

It is noted that the above process sequences describe a gate first process sequence for forming FinFETs. The present disclosure is not limited to only gate first processing. For example, gate last, which is also referred to as replacement gate processing, is also suitable for use with the methods and structures of the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

The methods and structures that have been described above with reference to FIGS. 1-21B may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device comprising:
    forming a high-k dielectric fin liner on at least one of a first plurality of fin structures in a first device region and a second plurality of fin structures in a second device region;
    forming a gate structure including a low-k dielectric gate sidewall spacer on a channel region of said at least one of the first and second plurality of fin structures;
    forming a first epitaxial semiconductor material on one for said first and second plurality of fin structures from which the high-k dielectric fin liner is removed, wherein a remaining portion of the high-k dielectric fin liner remains on a second of said first and second plurality of fin structures;
    oxidizing the first epitaxial semiconductor material;
    removing a remaining portion of the high-k dielectric fin liner; and
    forming a second epitaxial semiconductor material on said second of said first and second plurality of fin structures.

2. The method of claim 1, wherein said forming the high-k dielectric fin liner on at least one of the first plurality of fin structures in the first device region and a second plurality of fin structures in the second device region comprises:
    forming a material layer of high-k dielectric on the first and second plurality of fin structures;
    forming a block mask over material layer of the high-k dielectric that is present over the second plurality of fin structures;
    removing an exposed portion of the material layer of the high-k dielectric that is present over the first plurality of fin structures, wherein a remaining portion of the material layer of the high-k dielectric provides the high-k dielectric fin liner that is present on the second plurality of fin structures; and
    removing the block mask.

3. The method of claim 2, wherein forming a gate structure including a low-k dielectric gate sidewall spacer on the channel region of said at least one of the first and second plurality of fin structures comprises:
    forming the gate structure;
    depositing a low-dielectric layer on the gate structure and over the first and second plurality of fin structures; and
    etching the low-dielectric layer to form the low-k dielectric gate sidewall structure, wherein one of said low-k dielectric gate sidewall structure is present on the high-k dielectric fin liner.

4. The method of claim 3, wherein the first epitaxial semiconductor material comprises germanium.

5. The method of claim 4, wherein said oxidizing the first epitaxial semiconductor material forms an oxide including said germanium that obstructs said second epitaxial semiconductor material from being formed on the first plurality of fin structures in the first device region.

6. The method of claim 5, wherein the first epitaxial semiconductor material is comprised of a p-type conductivity dopant, and the second epitaxial semiconductor material is comprised of a n-type conductivity dopant.

7. The method of claim 1, wherein said forming the high-k dielectric fin liner comprises depositing the high-k dielectric fin liner on said first plurality of fin structures and said second plurality of fin structures.

8. The method of claim 7, wherein said forming the gate structure including said low-k dielectric gate sidewall spacer on the channel region of the at least one of the first and second plurality of fin structures comprises:
    forming the gate structure on the first and second plurality of fin structures, wherein the gate structure is deposited atop the high-k dielectric fin liner;
    forming a block mask over the second plurality of fin structures in the second device region;
    removing the high-k dielectric fin liner from the first device region, wherein the high-k dielectric fin liner remains in the second device region;
    removing the block mask; and
    forming said low-k dielectric gate sidewall spacer.

9. The method of claim 8, wherein forming the low-k dielectric gate sidewall spacer comprises:
    depositing a low-dielectric layer on the gate structure and over the first and second plurality of fin structures; and
    etching the low-dielectric layer to form the low-k dielectric gate sidewall structure, wherein one of said low-k dielectric gate sidewall structure is present on the high-k dielectric fin liner.

10. The method of claim 9, wherein the first epitaxial semiconductor material comprises germanium.

11. The method of claim 10, wherein said oxidizing the first epitaxial semiconductor material forms an oxide including said germanium that obstructs said second epitaxial semiconductor material from being formed on the first plurality of fin structures in the first device region.

12. The method of claim 11, wherein the first epitaxial semiconductor material is comprised of a p-type conductivity dopant, and the second epitaxial semiconductor material is comprised of a n-type conductivity dopant.

13. The method of claim 7, wherein said forming the gate structure including said low-k dielectric gate sidewall spacer on the channel region of the at least one of the first and second plurality of fin structures comprises:
- forming the gate structure on the first and second plurality of fin structures, wherein the gate structure is deposited atop the high-k dielectric fin liner;
- forming said low-k dielectric gate sidewall spacer;
- forming a block mask over the second plurality of fin structures in the second device region;
- removing the high-k dielectric fin liner from the first device region, wherein the high-k dielectric fin liner remains in the second device region; and
- removing the block mask.

14. The method of claim 13, wherein forming the low-k dielectric gate sidewall spacer comprises:
- depositing a low-dielectric layer on the gate structure and over the first and second plurality of fin structures; and
- etching the low-dielectric layer to form the low-k dielectric gate sidewall structure, wherein one of said low-k dielectric gate sidewall structure is present on the high-k dielectric fin liner.

15. The method of claim 14, wherein the first epitaxial semiconductor material comprises germanium, and wherein said oxidizing the first epitaxial semiconductor material forms an oxide including said germanium that obstructs said second epitaxial semiconductor material from being formed on the first plurality of fin structures in the first device region.

16. A method of forming a semiconductor device comprising:
- forming a dielectric fin liner comprising hafnium and oxygen on at least one of a first plurality of fin structures in a first device region and a second plurality of fin structures in a second device region;
- forming a gate structure including a SiOCN dielectric gate sidewall spacer on the channel region of said at least one of the first and second plurality of fin structures;
- forming a first epitaxial semiconductor material on one for said first and second plurality of fin structures from which the dielectric fin liner is removed, wherein a remaining portion of the dielectric fin liner remains on a second of said first and second plurality of fin structures;
- oxidizing the first epitaxial semiconductor material;
- removing a remaining portion of the dielectric fin liner; and
- forming a second epitaxial semiconductor material on said second of said first and second plurality of fin structures.

* * * * *